(12) United States Patent
Enouf et al.

(10) Patent No.: US 7,948,764 B2
(45) Date of Patent: May 24, 2011

(54) METHOD FOR MOUNTING AN ELECTRONIC COMPONENT ON A PREFERABLY SOFT SUPPORT, AND RESULTING ELECTRONIC ENTITY, SUCH AS A PASSPORT

(75) Inventors: Guy Enouf, Saint-Sylvain (FR); Xavier Borde, Rennes (FR); Florian Demaimay, Rennes (FR)

(73) Assignee: Oberthur Technologies, Levallois-Perret (FR)

( * ) Notice: Subject to any disclaimer, the term of this patent is extended or adjusted under 35 U.S.C. 154(b) by 982 days.

(21) Appl. No.: 11/663,555

(22) PCT Filed: Sep. 13, 2005

(86) PCT No.: PCT/FR2005/002266
§ 371 (c)(1),
(2), (4) Date: May 21, 2007

(87) PCT Pub. No.: WO2006/035128
PCT Pub. Date: Apr. 6, 2006

(65) Prior Publication Data
US 2009/0200064 A1    Aug. 13, 2009

(30) Foreign Application Priority Data

Sep. 24, 2004    (FR) .................................. 04 10146

(51) Int. Cl.
*H05K 7/00* (2006.01)
(52) U.S. Cl. ............ 361/760; 361/761; 29/825; 29/840; 438/106; 438/108; 438/612; 257/531; 257/758; 257/777; 257/778; 257/780; 257/783; 174/255; 174/258; 174/260; 428/323; 428/344

(58) Field of Classification Search ............... 361/760, 361/761; 29/825, 840; 438/108, 612, 106; 257/531, 758, 777, 778, 780, 783; 174/255, 174/258, 260, 161; 428/323, 344
See application file for complete search history.

(56) References Cited

U.S. PATENT DOCUMENTS

| | | | | |
|---|---|---|---|---|
| 4,749,120 | A * | 6/1988 | Hatada | 228/123.1 |
| 5,021,321 | A * | 6/1991 | Fukui et al. | 430/201 |
| 5,566,441 | A | 10/1996 | Marsh et al. | |
| 5,624,998 | A * | 4/1997 | Itoh et al. | 524/812 |
| 5,714,252 | A * | 2/1998 | Hogerton et al. | 428/344 |
| 5,840,417 | A * | 11/1998 | Bolger | 428/323 |
| 5,928,458 | A * | 7/1999 | Aschenbrenner et al. | 156/307.1 |
| 5,975,408 | A * | 11/1999 | Goossen | 228/173.2 |
| 6,118,183 | A * | 9/2000 | Umehara et al. | 257/783 |
| 6,189,208 | B1 * | 2/2001 | Estes et al. | 29/840 |

(Continued)

FOREIGN PATENT DOCUMENTS

EP    1167068    2/2000

(Continued)

*Primary Examiner* — Xiaoliang Chen
(74) *Attorney, Agent, or Firm* — Young & Thompson

(57) ABSTRACT

Method for mounting an electronic component, such as a silicon chip, on a support which consists in: providing an electronic component (40) having connection pads, whereof one predetermined pad (41A) is provided with a bump (42); providing a support having (30) to the predetermined pad via the bump; aligning the predetermined pad provided with the bump with the terminal; contacting the bump and the terminal and assembling them in specific temperature and pressure conditions. Prior to contacting and fixing the bump and the terminal, the surface of the terminal is covered with an insulating layer (32), the insulating layer being a material selected so as to be traversed by the bump in the temperature and pressure conditions.

19 Claims, 2 Drawing Sheets

U.S. PATENT DOCUMENTS

Figure 1:
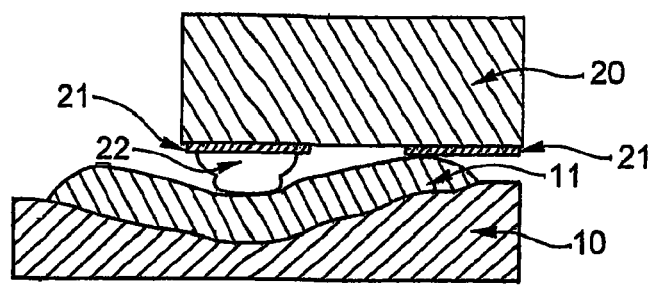

| | | | |
|---|---|---|---|
| 6,281,048 B1 | 8/2001 | Vere et al. | |
| 6,362,525 B1 * | 3/2002 | Rahim | 257/738 |
| 6,406,935 B2 | 6/2002 | Kayanakis et al. | |
| 6,410,415 B1 * | 6/2002 | Estes et al. | 438/612 |
| 6,483,195 B1 * | 11/2002 | Aoki et al. | 257/778 |
| 6,486,001 B1 * | 11/2002 | Ohshima et al. | 438/108 |
| 6,492,737 B1 | 12/2002 | Imasu et al. | |
| 6,507,119 B2 * | 1/2003 | Huang et al. | 257/778 |
| 6,534,723 B1 * | 3/2003 | Asai et al. | 174/255 |
| 6,573,610 B1 * | 6/2003 | Tsai | 257/780 |
| 6,639,299 B2 * | 10/2003 | Aoki | 257/531 |
| 6,686,650 B1 | 2/2004 | Gogami et al. | |
| 6,770,509 B2 | 8/2004 | Halope et al. | |
| 6,774,497 B1 * | 8/2004 | Qi et al. | 257/783 |
| 6,841,884 B2 * | 1/2005 | Shizuno | 257/777 |
| 6,846,699 B2 * | 1/2005 | Sakurai | 438/108 |
| 6,926,796 B1 * | 8/2005 | Nishida et al. | 156/312 |
| 6,927,018 B2 * | 8/2005 | Burgess | 430/324 |
| 6,981,317 B1 * | 1/2006 | Nishida | 29/840 |
| 7,183,650 B2 * | 2/2007 | Shiono et al. | 257/758 |
| 7,213,739 B2 * | 5/2007 | Wilson et al. | 228/180.22 |
| 2002/0060904 A1 * | 5/2002 | Higuchi | 361/760 |
| 2002/0062919 A1 * | 5/2002 | Oxman et al. | 156/275.5 |
| 2002/0066528 A1 * | 6/2002 | Oxman et al. | 156/275.5 |
| 2003/0067084 A1 * | 4/2003 | Shintani | 257/778 |
| 2004/0020040 A1 * | 2/2004 | Arneson et al. | 29/825 |
| 2004/0024105 A1 * | 2/2004 | Kim et al. | 524/492 |
| 2004/0026023 A1 * | 2/2004 | DeMeter | 156/247 |
| 2004/0134604 A1 * | 7/2004 | Oxman et al. | 156/275.5 |
| 2005/0023704 A1 * | 2/2005 | Lin et al. | 257/781 |

FOREIGN PATENT DOCUMENTS

FR          2779255          12/1999

* cited by examiner

METHOD FOR MOUNTING AN ELECTRONIC COMPONENT ON A PREFERABLY SOFT SUPPORT, AND RESULTING ELECTRONIC ENTITY, SUCH AS A PASSPORT

The invention concerns the production of an electrical connection between an electronic chip and its support, for example a soft support, such as that of a passport with integrated chip.

It has already been proposed to fabricate passports in which an identification chip is integrated into a sheet, for example a cover, and is connected to an antenna, produced within the thickness of that sheet, thanks to which this chip can communicate with the outside world without contact (there is therefore no visible contact pad, which ensures great discretion).

Thus, according to a known technique, a passport is produced by means of an antenna screenprinted directly onto the cover (for example using a conductive ink containing silver). A chip is then mounted, using the "flip-chip" technique (this entails mounting it after flipping it (turning it over), generally effected with greater accuracy than in normal mounting, blind), so that certain predetermined pads thereof are electrically connected to appropriate terminals of the antenna.

In practice, these predetermined pads are provided beforehand with bosses (sometimes called "bumps"), which constitute projections relative to the level of these pads and of those adjacent to them, and which in theory guarantee, in particular in the case of mounting a chip in a microchip card (thus with a rigid support), that the antenna terminals, independently of their size, will not come into contact with these pads adjacent to those that must actually be connected.

However, it proves that, in a flexible product such as the cover of a passport, the step of production of the connection between the chip and the antenna terminals is disturbed by the fact that the support is soft (in practice it is paper) and the pads of the chips may be very close together. If the chip is pressed against the terminals of the antenna (thus against the soft support), this support can be deformed (by depression) only locally, so that the lateral portions of the terminals, which are not depressed, can create unwanted connections with adjacent pads of the chip, despite the absence of bosses thereon. This leads to risks of short circuits although checks on the connection operation may have proved entirely satisfactory.

Such a situation is represented in FIG. 1, in which the support 10, locally covered by a conductive ink terminal 11, has become curved upon depressing a chip 20 with pads 21 of which that on the left is provided with a boss 22: this boss locally depresses the support and the ink, while a lateral portion of the terminal 11, not depressed as far, comes into contact with the pad 21 on the right. In fact, the conductive ink terminal is here represented as having a substantially constant thickness, but it must be noted that, as a function of the technology used for depositing the terminal, in particular in the case of screenprinting, there may in practice be formed small lateral beads of ink (not represented) the height whereof can be of the same order as that of the bosses and which therefore also generate a risk of unwanted contact with adjacent pads.

The distance between two adjacent pads may in fact be only of the order of 60 microns, while their side length is of the order of 80 microns, whereas the area of the antenna terminals may be as much as of the order of one square millimeter, with a width that is typically at least equal to 150 microns (in the case of screenprinting, in particular with an ink incorporating conductive silver flakes with a diameter of 80 microns). In practice it may be considered that there is a risk of the problem cited above occurring whenever there are pads whose (center to center) distance falls below 250 microns.

Reducing the dimensions of the terminals might be considered, but this would imply very seriously increasing the positioning constraints, to the point of preventing any real mass production. It is pointed out here that a chip placement machine with the overturning ("flip-chip") option, for example of the kind fabricated by the company DATACON (the cost whereof can be of the order of 300.000 euros) includes a system for automatically recognizing the pads on the chip and alignment patterns on the support (a passport in the example considered here). The machine recovers the chip (in practice from a disk with a diameter of the order of 300 mm formed of a multitude of similar chips), flips it and places it on the support as a function of the positions detected. Given that such a line, with such an operating option, is relatively slow (it cannot exceed 1000 parts per hour), it would appear unacceptable to increase further the positioning constraints.

Clearly the same kind of problem may arise if it is required to use pads or terminals of soft materials, even if the material constituting the support is not particularly soft, or again if the technique for formation of the terminals has produced large lateral beads, even on a rigid support. Moreover, the terminal or terminals considered may be connected to one or more other circuits other than an antenna, such as another processor, a screen, etc; likewise, the connection in question may concern not only pads of a chip but also those of any other electronic component, for example those cited above.

An object of the invention is to alleviate the drawbacks cited above, and the invention is aimed in particular at a method of mounting an electronic component, in particular an electronic chip, on a support, which method minimizes the risk of unintended connection of a pad of the component to a terminal, even if the support is soft or if there is a risk, given the technique for formation of the terminal, of lateral beads appearing, whilst enabling a satisfactory mass production throughput, without having to increase the usual constraints with respect to positioning of the component vis-à-vis the support, and even relaxing them. The invention is also aimed at an electronic entity including an electronic component, such as an electronic chip, mounted on a support, in particular but not necessarily an identity document such as a passport, where pads of the component are reliably connected to terminals formed on the support, with no unwanted connection between any such terminal and another pad, even if the support is soft or if the terminals include lateral beads, and even if the terminal(s) is (are) of large size.

To this end the invention proposes a method of mounting an electronic component on a support, wherein:
an electronic component is taken that includes connection pads, including at least one predetermined pad provided with a boss,
a support is taken that includes at least one terminal to be electrically connected to said predetermined pad through the intermediary of said boss,
this predetermined pad provided with the boss and this terminal are placed facing each other, this boss and this terminal are brought into contact and they are fixed the one to the other, under given conditions of temperature and of pressure,
characterized in that, before bringing this boss and this terminal into contact and fixing them, the surface of this terminal is covered by an insulative layer, this insulative layer being of a material chosen to have this boss pass through it under said conditions of temperature and pressure.

Thus, the electrical connection between a terminal and a pad that must be connected to it is established by a boss with which that pad is provided and which, at the time of bringing the component into contact with the support, passes through the insulative layer; the insulative layer therefore remains everywhere else and maintains the electrical insulation between this terminal and any other pad that it is not intended to connect to it (and which has therefore not been provided with a boss).

The invention applies particularly well to the case where the component is an electronic chip.

The benefit of the invention may be apparent in many cases of supports, in particular rigid supports: in this case, the presence of an insulative layer can relax the constraints on the conditions for bringing into contact and fixing the pad and the terminal by way of the boss; the fixing of the boss and the terminal now has less chance than in the known solutions of provoking an unwanted electrical connection between this terminal and another pad, especially if the formation of the terminals has caused lateral beads to appear. However, the invention is also especially beneficial in the case where the support is a material capable of being crushed under given conditions of temperature and pressure, since it is with such a type of support that the drawbacks described hereinabove with reference to the fabrication of passports may occur.

This idea of a soft support (such a support may also said to be compressible) can cover a wide range of materials, which comprises first of all the case of supports made from a fibrous material, which corresponds to a wide range of supports of moderate cost; there are found therein in particular materials based on paper, easy to obtain at moderate cost. Another beneficial example of a material that may be soft (if a sufficiently small thickness is chosen) is that of plastic materials, for example PVC. It may be noted with regard to soft supports that, in certain cases, they may have the capacity of having the boss pass at least partly through them, like the insulative layer (and therefore the terminal concerned), which may result in a better electrical contact with that terminal.

Clearly the method may be applied to sheet supports, and is advantageously applied to the production of identity documents (passports, but also, possibly, access cards, identity cards, etc).

The boss may in principle have any shape, including that of a simple overthickness on a pad, provided that the insulative layer can have the boss pass through it under the conditions of temperature and pressure applied at the time of bringing into contact and fixing. However, to encourage the penetration of the boss into the insulative layer, it is preferable if the latter advantageously has a shape which becomes smaller in the direction away from the pad.

In particular, the invention exploits bosses known in themselves (sometimes called "stud bumps"), obtained by melting the end of a fusible wire and which have a general ball shape (more or less irregular) provided with a wedge-shaped, or even pointed, portion, generally considered until now as being rather a disadvantage. The thickness of the boss, without the wedge-shaped portion, is preferably from 20 to 50 microns. Alternatively, the boss may have pyramidal or prismatic portions. Clearly, the more pointed the geometry of the boss, the more its passing through the insulative layer may be deemed similar to a piercing of that layer, which may continue into the material constituting the terminal, and even the support.

The boss is generally of gold or gold alloy, although other materials may be considered, such as the alloys of copper for example.

The support preferably includes at least two terminals.

The terminals may be produced by screenprinting (even by stamp pad printing or flexography) using a conductive ink. Alternatively, the ink may be deposited by heliogravure, offset printing, etc; the terminals may also be obtained by growing a metal or a metallic alloy (for example of copper), for example by electrolysis; in practice, the terminals may be formed at the same time as the conductive tracks of which they constitute the ends, for example the tracks of an antenna. It is worth noting that, for a certain number of flexible supports, the terminals may also be formed by conventional photoengraving.

Given the good insulation of the terminals from pads not provided with bosses, the invention enables these terminals to have a large area, which can thus be from 66% to 95% of the surface of the support facing the electronic chip. This results in a significant reduction in the positioning constraints at the time of bringing into contact. These terminals preferably have an individual area greater than one square millimeter.

Nor is there a limit on the area of the insulative layer, which is entirely favorable to minimizing unwanted connections. Thus it may cover the terminals that the support includes in the region in which the component must be mounted. It may even extend at least over the major portion of the surface of the support that is facing the electronic component during the step of bringing into contact. This layer may be continuous or discontinuous (in particular, there is advantageously a separation between the respective portions of this layer that cover the terminals).

In one particularly beneficial case, the terminals are part of an antenna formed on the support (which enables contactless exchange between the component and the outside world), and the insulative layer covers at least the major portion of the antenna, in which this layer has, with respect to the component, an insulative function and, moreover, a protection function, for example a mechanical or moisture protection function, in respect of the antenna and its support (especially if it is fibrous).

The insulative layer may be made from diverse materials.

In fact, without wishing to be limited by a physical explanation, the ability to pass through the insulative layer (which depends essentially on the material that constitutes it) may be a capacity of that layer to be evacuated laterally, by a kind of creep, in response to the thrust of the boss, or a capacity of that layer to be perforated, depending on the geometry of the boss.

Thus the insulative layer is advantageously an insulative varnish, which corresponds to a well known category of materials. This insulative varnish is preferably chosen to have a polymerization energy of less than 1000 mJ/cm$^2$, preferably of the order of 500 mJ/cm$^2$, which results in low shrinkage, and in practice induces no ripples on the support after drying and/or cooling.

The insulative layer may also be a non-conductive ink, however.

Whether it is a varnish or an insulative ink, the insulative layer can in particular be deposited by screenprinting. This insulative layer may be used as the support for a transverse conductive strand forming a conductive bridge between two antenna tracks to be connected in series (see for example the document FR-2787609).

The insulative layer may also be a fibrous material, however, for example a thin sheet of paper (15 microns thick, for example).

In fact, whatever the material constituting the insulative layer, its thickness is advantageously from 5 to 25 microns, preferably from 10 to 15 microns.

According to advantageous features known in themselves in the fabrication of microchip cards, after the step of bringing into contact, the space between the support, provided with its terminals and the insulative layer, and the electronic chip is filled with a filler resin and/or the electronic chip is buried in a protection resin.

An electronic entity obtained by the method of the invention is recognized in that it is an electronic entity including an electronic component, for example an electronic chip, on a support, that support including at least one terminal and that electronic component including pads at least a predetermined one of which is provided with a boss electrically connecting that pad to that terminal, characterized in that the terminal is covered with an insulative layer through which the boss passes.

Such an electronic entity obtained by the method of the invention advantageously has the feature that the terminal further faces a pad adjacent to the predetermined pad, that adjacent pad having no boss and being separated from the terminal at least by said insulative layer.

Other advantageous features of this entity correspond to the advantageous features of the method of the invention mentioned hereinabove.

Figure 2:
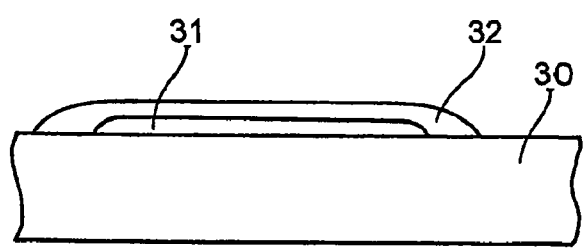
Figure 3:
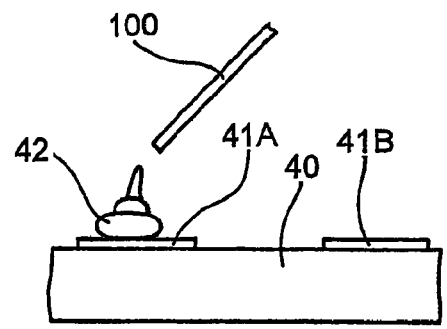
Figure 4:
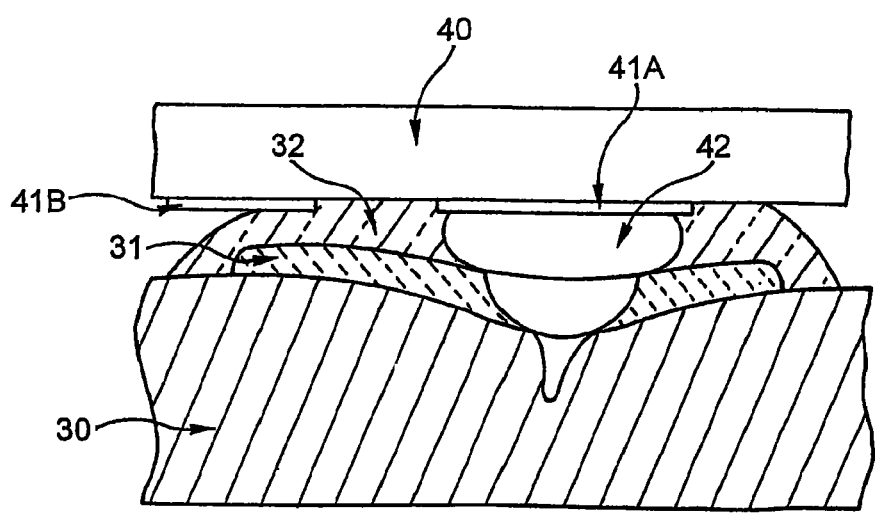
Figure 5:
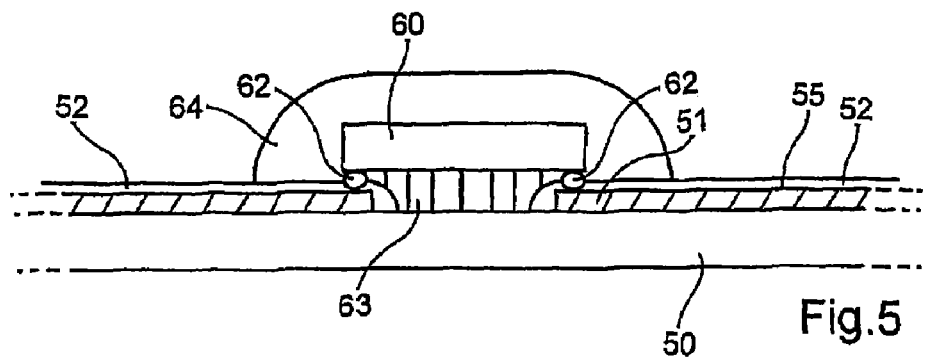
Figure 6:
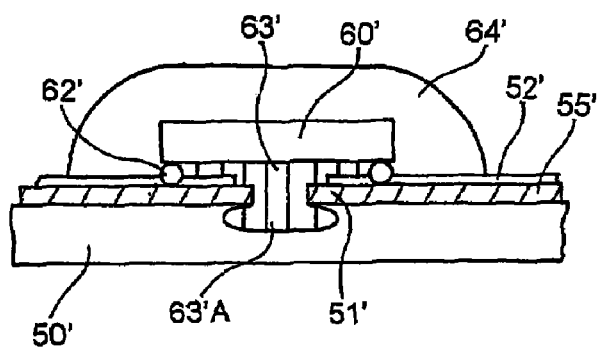
Figure 7:
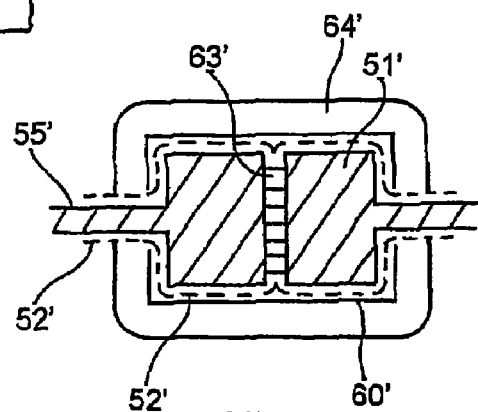
Figure 8:
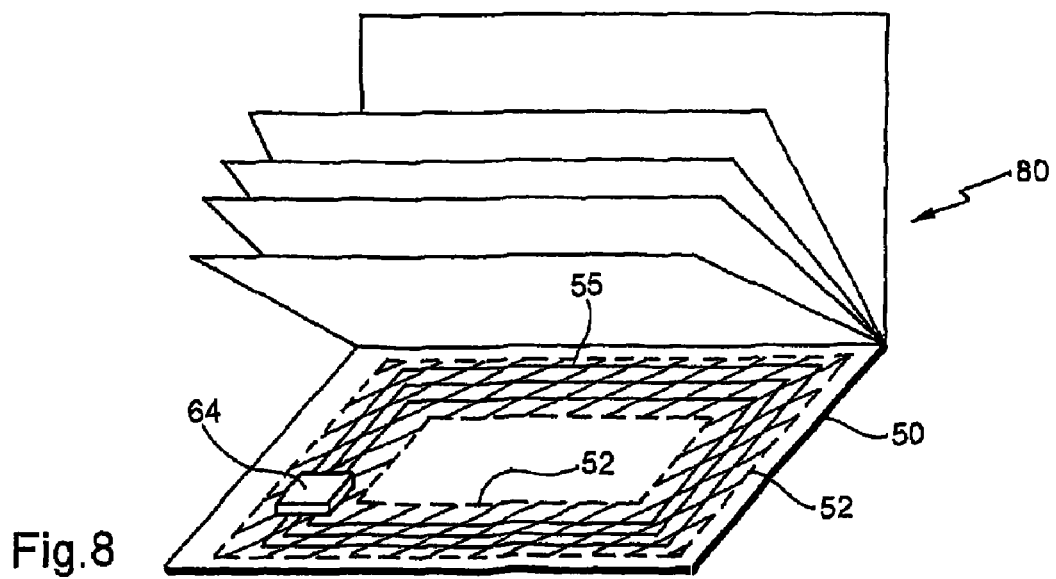

Objects, features and advantages of the invention emerge from the following description, given by way of illustrative and nonlimiting example, with reference to the appended drawings in which:

FIG. 1 is a diagram of a detail of a section of the connection area between a pad of a chip and an underlying terminal, according to the prior art, FIG. 2 is a view in section of a detail of a support during a first step of the method of the invention, FIG. 3 is a view in section of a detail of a chip to be connected to the support from FIG. 2, in accordance with the invention, FIG. 4 is a detail view in section, analogous to that of FIG. 1, of the result of mounting the electronic chip in accordance with the invention from FIG. 3, after flipping it, on the support from FIG. 2, FIG. 5 is a diagrammatic view in section of an electronic entity conforming to one embodiment of the invention, FIG. 6 is a diagrammatic view in section of another electronic entity, according to another embodiment, FIG. 7 is a bottom view of the entity from FIG. 6, in the plane of the upper surface of the support, and FIG. 8 is a diagrammatic perspective view of a passport one sheet whereof includes a chip mounted on a support conforming to FIG. 5.

FIG. 3 represents an electronic component 40, here an electronic chip, intended to be mounted, in accordance with the invention, on the support 30 from FIG. 2.

The support 30 carries a terminal 31 (connected to a circuit not represented, also carried by the support, for example an antenna, see below). According to the invention, before mounting the chip thereon, the surface of this terminal is covered with an insulative layer 32.

As for the chip 40, it includes connection pads, including pads 41A and 41B, of which one, here the pad 41A, is intended to be connected to the terminal 31; this pad is provided with a boss 42.

The mounting of the chip on the support consists in placing the pad 41A provided with its boss (after flipping the chip compared to its configuration in FIG. 3) facing the terminal 32 of the support and then bringing this boss and this terminal into contact and fixing them, under predetermined conditions of temperature and pressure, the constituent material of the insulative layer being such that, in said temperature and pressure conditions, the boss passes through the insulative layer and establishes the connection of the pad with the terminal, without exposing the rest of the surface of the terminal. Consequently, although the support is slightly depressed at the location on which the boss 42 bears, the insulative layer 32 prevents the left-hand lateral portion of the terminal 31 from coming into contact with the pad 41B, unlike what was noted with reference to FIG. 1.

In the example considered, the support is in fact advantageously made from a material capable of being crushed in the conditions of temperature and pressure, i.e. the invention may be applied to soft materials, such as fibrous materials, advantageously in sheet form. Thus the support may in particular be of paper. It is a question for example of the paper sold by the company FIBER MARK under the designation SECURALIN®. Alternatively, it may also be a question of a fibrous material of the synthetic fiber paper type, etc.

Alternatively, this support is a sheet of plastic material, for example of PVC, with a thickness advantageously less than 200 microns.

As will emerge later the choice of the paper, or of a plastic material, means in particular that the invention may be applied to an identity document.

The boss with which the pad to be connected is provided may be a boss of any shape, for example globally parallelepipedal (obtained by electrolytic growth, for example), but it advantageously has a shape that gets smaller in the direction away from the pad, so as to facilitate passing through the insulative layer during the step of bringing into contact/fixing.

This shape may thus be that of a spherical or flattened ball.

However, this boss preferably includes a wedge-shaped portion (for example a prismatic or pyramidal portion), or even a pointed portion. Thus the boss is advantageously of the type called a "stud bump", i.e. it is obtained by melting the end of a fusible wire, thanks to which this boss has the shape of a ball that includes a pointed portion. The obtaining of such a boss is shown diagrammatically in FIG. 3 in which is seen the wire 100 from which has just been detached a small mass forming the boss 42. This boss may be obtained by an ultrasonic welding machine, starting by placing the wire in a capillary tube; a ball is defined by melting the end of the wire by an electrical discharge and this ball is then crushed against the pad. The capillary tube has a shape such that a small tail is created when the capillary rises and the wire breaks at its junction with the ball. The diameter of such a boss is typically 25 microns or 32 microns as a function of the operating conditions or the wires.

A boss like that from FIG. 3 has, without the wedge-shaped portion (namely the tail cited above), a thickness that is typically of the order of 20 to 50 microns, for example about 40 microns.

It is worth noting that, in FIG. 4, not only does the boss pass through the insulative layer, but it further passes through the layer forming the terminal and penetrates into the support itself, which ensures a very good electrical contact, with a very good mechanical strength of this connection.

The boss is advantageously of gold or gold alloy, it being clearly understood that other conductor materials may be used.

FIG. 5 represents an electronic entity obtained by the method that has just been described, although with variants.

This FIG. 5 represents a support 50 on which a chip 60 has been mounted. This support is represented with two terminals 51 extended on the right as on the left by a conductive track 55.

Here these terminals are both covered by the insulative layer 52. However, the latter is discontinuous here in the sense that it does not extend over the surface of the support between these two terminals; this insulative layer nevertheless extends here over at least the major portion of the surface of the support (covered or not by the terminals) facing the chip; it further extends here over track portions 55 of which these terminals are extensions.

Before or after bringing the bosses 62 into contact with the terminals 51 (the pads are not represented), a filler resin 63 is advantageously deposited so as to fill the space between the support, provided with its terminals and the insulative layer, and the electronic chip; this filler resin 63 is sometimes called an "underfill". Moreover, the electronic chip has further been buried in a protection resin 64. The presence of such filler and/or protection resins being known in itself in the microchip card field, they will not be described here.

FIGS. 6 and 7 represent a different embodiment of the electronic entity from FIG. 5. The elements of the entity from these FIGS. 6 and 7 that are analogous to those of the entity from FIG. 5 are assigned the same reference numbers but followed by the "prime" suffix.

It is seen that the terminals 51' are larger than in FIG. 5, to the point of covering from 66% to 95% of the surface of the support facing the electronic chip (leaving, of course, a space between the terminals to prevent any short circuit between them). The area of these terminals may exceed one square millimeter.

Moreover, the insulative layer 52' extends, like that of the layer 52 from FIG. 5, over virtually all of the surface of the support facing the chip as well as over track portions 55 terminating at these terminals 51, here also with a spacing between its respective portions covering the terminals. On the other hand, the filler resin 63' here extends furthermore into the mass of the support, between the terminals, to the point of provoking an anchorage 63'A in the support. Of course, this anchorage is represented with a highly exaggerated depth, and can be produced in particular only with a support capable of being wetted by this filler resin.

The insulative layer may extend over as large an area as may be required for reasons of protection or for any other reason.

Thus, in FIG. 8, in which the support 52 from FIG. 5 is represented in the form of the cover, for example of paper, of an identity document, here a passport, the chip (which cannot be made out in the mass of protection resin 64) is connected, through the intermediate of the terminals, to a circuit also carried by this support, here an antenna 55. The insulative layer extends not only between the chip and the terminals (except where the bosses pass through it) but also over the whole of the antenna.

The insulative layer may be of diverse kinds. Thus it may be produced from an insulative varnish, which corresponds to a type of material that is easy to apply; it is known how to deposit it and to dry it by proven techniques. This varnish is advantageously chosen to have a polymerization energy of less than 1000 mJ/cm$^2$, preferably of the order of 500 mJ/cm$^2$, which confers a low shrinkage on this insulative varnish, and therefore minimizes the phenomena of ripples that may affect the sheet after mounting and fixing the chip. This varnish is for example a varnish known as ACHESON PF455.

In an alternative that is not represented, the insulative layer may also be produced with the aid of a non-conductive ink.

This insulative layer may be deposited by screenprinting. Alternatively spraying may be used.

This layer may also be produced from a fibrous material, however, for example from paper (for example a thin sheet of 15 microns thickness).

Whatever its composition, this insulative layer typically has a thickness from 5 to 25 microns, preferably from 10 to 15 microns, which is a good compromise enabling the bosses to pass through at the same time as maintaining good electrical insulation elsewhere.

The temperature and pressure conditions applied during the mounting of the chip may, in the case considered here of a varnish, be the conditions of polymerization of the resin constituting that varnish, for example: heating head at 180° C., at a pressure of 370 grams for 8 seconds. However, the temperature of the table supporting the sheet forming the support is advantageously reduced to around 45° C. (a temperature of 60° C. can in theory compensate the losses, but may prove too high to prevent softening of the varnish, which might then impede the passage of the bosses).

It will be realized that according to the invention:
only the pads that must be connected are connected,
there is no imperative as to the size of the terminals,
the chip positioning constraints are very moderate, typically ±0.5 mm,
it is even possible to deposit the chips blind (the machine no longer needs to be able to recognize the pads on the chip),
it is no longer necessary to have the positioning accuracy of machines that have the "flip-chip" option (it suffices to position the chips in already flipped configuration), which makes it possible both to use machines less costly than the high-accuracy machines capable of effecting such flipping and to achieve high throughputs, for example of the order of 5000 chips per hour,
the same material (that of the insulative layer) provides at one and the same time good insulation in the vicinity of the chip and good protection of the circuit to which the terminals lead.

The invention claimed is:

1. A method of mounting an electronic component on a support, comprising:
    taking an electronic component provided with connection pads, wherein the component is an electronic chip, one of these connection pads being provided with a boss having a shape that gets smaller in the direction away from the connection pad;
    taking a support which is part of an identity document, that support carrying an antenna with at least one antenna terminal to be electrically connected to said one of the connection pads which is provided with the boss, via said boss, the terminal being made of a conductive ink;
    covering the surface of the antenna terminal by an insulative layer made of an insulating varnish, a non-conductive ink or a fibrous material;
    then placing the pad provided with a boss and the antenna terminal facing each other and bringing them into contact and fixing them the one to the other under given conditions of temperature and pressure where the material of the support may be crushed, so that the boss pass through the insulative layer as a result of the boss's shape; and
    then depositing a filling resin so as to fill the space between the support with the support's terminals and the insulative layer, and the electronic component.

2. The method according to claim 1, wherein the support is made of a fibrous material.

3. The method according to claim 2, wherein the support is made of a paper-based material.

4. The method according to claim 1, wherein the support is made of a plastic material.

5. The method according to claim 1, wherein said boss is formed by melting the end of a fusible wire, thanks to which the boss has the shape of a ball that includes a wedge-shaped portion.

6. The method according to claim 5, wherein the thickness of the boss, without the wedge-shaped portion, is from 20 to 50 microns.

7. The method according to claim 1, wherein the boss is caused to pass through the insulative layer and the terminal until it penetrates into the support.

8. The method according to claim 1, wherein the boss is of gold or of gold alloy.

9. The method according to claim 1, wherein the support includes at least two terminals.

10. The method according to claim 9, wherein these terminals cover from 66% to 95% of the surface of the support that faces the electronic component.

11. The method according to claim 9, wherein the insulative layer, continuous or not, covers these terminals.

12. The method according to claim 11, wherein the insulative layer extends at least over the major portion of the surface of the support that faces the electronic component during the step of bringing into contact.

13. The method according to claim 9, wherein the insulative layer covers at least the major portion of the antenna.

14. The method according to claim 1, wherein the insulative layer is an insulative varnish.

15. The method according to claim 14, wherein the insulative varnish is selected to have a polymerization energy of less than 1000 mJ/cm$^2$, which confers on it a low shrinkage.

16. The method according to claim 15, wherein the insulative varnish has a polymerization energy of the order of 500 mJ/cm$^2$.

17. The method according to claim 1, wherein the insulative layer is deposited by screenprinting.

18. The method according to claim 1, wherein the thickness of the insulative layer is from 5 to 25 microns, preferably from 10 to 15 microns.

19. The method according to claim 1, wherein the support is part of a passport.

* * * * *